(12) United States Patent
Shah (10) Patent No.: US 9,059,669 B2
(45) Date of Patent: Jun. 16, 2015

(54) SOUND CONTROL FOR NETWORK-CONNECTED DEVICES

(71) Applicant: QUALCOMM Incorporated, San Diego, CA (US)

(72) Inventor: Tejash Rajnikant Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/018,818

(22) Filed: Sep. 5, 2013

(65) Prior Publication Data
US 2015/0063598 A1    Mar. 5, 2015

(51) Int. Cl.
*H03G 3/00* (2006.01)
*H04R 29/00* (2006.01)
(Continued)

(52) U.S. Cl.
CPC .. *H03G 3/00* (2013.01); *G08B 3/10* (2013.01); *H03G 3/24* (2013.01); *H04R 2430/01* (2013.01)

(58) Field of Classification Search
CPC ......... H03F 1/021; H03F 1/36; G06F 3/0489; G01H 3/14; G10H 3/186; H03G 1/02; H03G 1/0088; H03G 3/001; H03G 3/02; H03G 3/04; H04M 9/08; H04N 11/00; H04R 1/02; H04R 1/20; H04R 1/2826; H04R 1/2834; H04R 1/35; H04R 3/00; H04R 3/02; H04R 3/04; H04R 3/002; H04R 3/005; H04R 3/12; H04R 27/00; H04R 27/02; H04R 2217/03; H04R 2420/07; H04R 25/453; H04R 25/505; H04R 25/552; H04R 25/554; H04R 25/558; H04R 25/70; H04R 29/00; H04R 29/007; H04R 5/04; H04R 9/06; H04S 1/002; H04S 3/00; H04S 7/40

USPC .......... 381/56, 77, 82, 83, 96, 104, 105, 109, 381/315, 337
See application file for complete search history.

(56) References Cited

U.S. PATENT DOCUMENTS 5,987,106 A    11/1999 Kitamura
6,404,891 B1 *  6/2002 Seitz et al. .................... 381/107
(Continued)

FOREIGN PATENT DOCUMENTS

WO    2004100361 A1    11/2004
WO    2006094401 A1     9/2006
(Continued)

OTHER PUBLICATIONS

"Peer-to-peer", Peer-to-peer—Wikipedia, the free Encyclopedia http://en.wikipedia.org/wiki/Peer-to-peer Date obtained from the internet Apr. 12, 2013, 11 pages.
(Continued)

*Primary Examiner* — Khai N Nguyen
(74) *Attorney, Agent, or Firm* — DeLizio Law, PLLC (57) ABSTRACT

A first device receives a sound suppression message from a second device via a communication network. The sound suppression message indicates that the second device will produce an audible sound. The first device determines a sound profile associated with the second device. The first device then modifies (e.g., suppresses or reduces) a volume of sound that that the first device (or a third device) produces in response to receiving the sound suppression request message and based, at least in part, on the sound profile associated with the second device. The sound profile can include a device identifier associated with classes, models, and makes of devices.

35 Claims, 9 Drawing Sheets

(51) Int. Cl.
*G08B 3/10* (2006.01)
*H03G 3/24* (2006.01)

(56) References Cited

U.S. PATENT DOCUMENTS

| | | | |
|---|---|---|---|
| 6,980,056 B1* | 12/2005 | Alexander et al. | 330/284 |
| 7,206,413 B2* | 4/2007 | Eid et al. | 381/22 |
| 2003/0002688 A1* | 1/2003 | Kanevsky et al. | 381/74 |
| 2003/0142833 A1* | 7/2003 | Roy et al. | 381/73.1 |
| 2004/0028245 A1* | 2/2004 | Gierse | 381/104 |
| 2004/0208324 A1* | 10/2004 | Cheung et al. | 381/77 |
| 2007/0053527 A1* | 3/2007 | Barbieri et al. | 381/104 |
| 2013/0219053 A1* | 8/2013 | Quade et al. | 709/224 |
| 2013/0272125 A1* | 10/2013 | Espina Perez et al. | 370/230 |
| 2013/0300547 A1* | 11/2013 | Park et al. | 340/12.22 |

FOREIGN PATENT DOCUMENTS

| | | |
|---|---|---|
| WO | 2007052205 A1 | 5/2007 |
| WO | 2010039657 A2 | 4/2010 |

OTHER PUBLICATIONS

"Purpose of Alljoyn", Alljoyn https://www.alljoyn.org/about Date obtained from the internet Apr. 12, 2013 2012 , 4 pages.

* cited by examiner

SOUND CONTROL FOR NETWORK-CONNECTED DEVICES

BACKGROUND

Embodiments of the inventive subject matter generally relate to the field of communication technology, and, more particularly, to control of sound producing devices coupled to a network.

An increasing variety of devices (such as, appliances, consumer devices, computers, and other electronics) may be communicatively coupled to a network. For example, home networks may include devices such as televisions, phones, radios, game systems, microwave ovens, refrigerators, coffeemakers, stoves, etc. Many devices commonly found in homes, offices, or other environments generate alarms (e.g., audible alerts) to induce attention to the device. For example, when a microwave oven has completed its heating operations, the microwave oven may produce an audible alarm to indicate the heating operations are complete. However, the audible alarm may not be heard if other devices (e.g., a television or radio) are also producing sound at a sufficiently high volume to prevent the audible alarm from being heard.

SUMMARY

Various embodiments are disclosed for implementing coordination of alarm producing devices and sound producing devices coupled to a network. In one embodiment, a first device may receive a sound suppression message from a second device via a network. The sound suppression message may indicate that the second device will produce an audible sound. The first device may determine a sound profile associated with the second device. The first device may then modify (e.g., suppress or reduce) a volume of sound that the first device or another device produces in response to receiving the sound suppression request message and based, at least in part, on the sound profile associated with the second device.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary techniques (e.g., systems, methods, instruction sequences and computer program products) and embodiments of the present subject matter. However, it is understood that the described embodiments may be practiced without these specific details. For instance, although examples refer to use of the technology in a residential setting, embodiments may be practiced in a business, school, hospital, vehicle, or any environment in which an alarm may compete for attention among multiple stimuli. Additionally, although the example devices are depicted as incorporating a control unit and a detection unit, such units are not necessarily required to implement various embodiments of this disclosure. Moreover, although examples refer to one, two, or three devices, a plurality of devices can interact with one another as described herein. In this disclosure, well-known instruction instances, protocols, structures and techniques have not been shown in detail in order not to obfuscate the description.

The present disclosure describes techniques for controlling sound of a first device coupled to a network responsive to an audible alarm to be generated at a second device coupled to the network. In one embodiment, a first device, can receive a sound suppression request message via a network, from a second device. The sound suppression request message can be an indication that the second device has been triggered to produce (also sometimes referred to as emitting, generating, or sounding) an audible sound. The first device can determine a sound profile associated with the second device. For example, a sound profile may include the tone, frequency, duration, and volume of audible alarms that a second device might generate. Another example of a sound profile can be a device identifier associated with classes of devices such that the device identifier can be interpreted to determine the sound profile of a device. A sound profile may include information about the tone, frequency, duration, priority, and volume of sound that such class of device can generate. For instance, an alarm clock might have a first sound profile associated with a higher priority than a second sound profile for an alarm of a microwave oven. The first device may modify (e.g., suppress or reduce) a volume of sound that the first device (or a third device) produces based, at least in part, on the sound profile associated with the second device.

Figure 1:
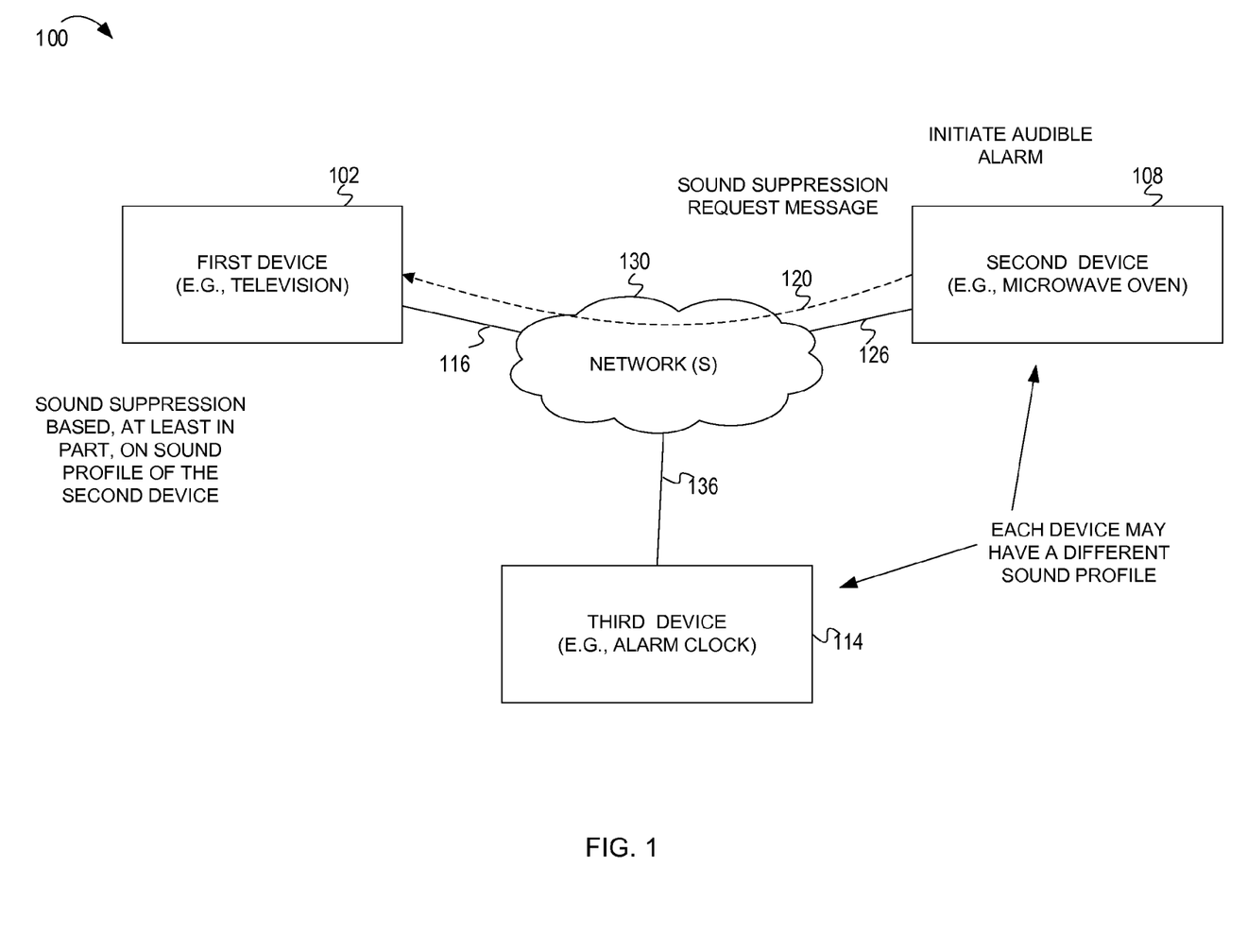
FIG. 1 is a system diagram illustrating an example implementation in which devices are coupled to a network in accordance with at least one embodiment of the present disclosure.

FIG. 1 is a diagram of a system 100 illustrating an example implementation in which a plurality of devices 102, 108, and 114 are coupled to a network 130 in accordance with at least one embodiment of the present disclosure. The devices 102, 108, 114 may utilize wireless or wired communications connections to communicate via the network 130 with other devices, or with each other. The first device 102 is communicatively coupled (shown as line 116) to network 130. The second device 108 and the third device 114 also are communicatively coupled (shown as lines 126 and 136, respectively) to network 130. In accordance with at least one embodiment of this disclosure, a first device 102 can receive a sound suppression request message 120 from a second device 108 responsive to the second device 108 preparing to generate an audible alarm. The sound suppression request message 120 may be a unicast message directed at the first device 102 or may be a broadcast message transmitted via the network 130 such that multiple devices may receive the sound suppression request message 120. Several illustrative examples will be described to aid in understanding the sound suppression request message 120.

In a first illustrative example, the first device 102 can be a television, and the second device 108 can be a microwave oven. The microwave oven may be configured to generate an audible alarm to indicate that heating operations have completed. However, the tone, frequency, or volume of sound that a television produces might interfere with the alarm that the microwave oven produces such that the alarm from the microwave oven cannot be heard. In accordance with this disclosure, the microwave oven may transmit a sound suppression request message 120 to the television. In some implementations, the sound suppression request message 120 can include information about the sound profile of the microwave oven. For example, the sound suppression request message 120 may include information about the tone, frequency, duration, and volume of the audible alarm expected to be produced by the microwave oven. Alternatively or additionally, a sound suppression request message 120 might include a device type identifier associated with a class of devices. For instance, a device type identifier can be a numeric value associated with a microwave oven or another device like an alarm clock. The device type identifier will be discussed in more detail in FIGS. 6 and 7. The television can use the sound profile data of the microwave oven included in the sound suppression request message 120 to adjust the tone, frequency, or volume of sound that the television produces such that the alarm from microwave oven will be audible. The sound suppression request message 120 may be sent prior to, during, or after the second device produces an alarm.

The system 100 might include a plurality of devices such as a third device 114. Devices 102, 108, 114 can transmit or receive a sound suppression request message 120 to or from each other. Continuing with the previous illustrative example, the third device 114 can be an alarm clock that also has a radio. If the alarm clock is in a state to generate an audible alarm, the alarm clock can transmit a sound suppression request message 120 to the television and the microwave oven. Depending on the sound profile of the audible alarm from the alarm clock, the television may determine whether to suppress or reduce the volume of sound from the television. For example, if the alarm clock indicates that the alarm is a buzzer, the television may suppress the television volume. If the alarm clock indicates that the alarm is a radio, the television may determine not to suppress the television volume. It should be understood that these illustrative examples are non-limiting and used for the purpose of showing that the first device 102 may determine to suppress or reduce volume using sound profile associated with the device making the sound suppression request.

In another illustrative example, the first device 102 can be a sound system (e.g., radio, compact disk player, or the like) in a vehicle. The second device 108 can be detector with an alarm to indicate that the vehicle is too close to another vehicle. The third device 114 can be a cell phone located in the vehicle and communicatively coupled to the sound system and/or the detector. The detector may transmit a sound suppression request message 120 to the sound system, perhaps responsive to detecting proximity of another vehicle. The cell phone may simultaneously transmit a sound suppression request message (not shown) to the sound system, perhaps responsive to an incoming phone call. Each sound suppression request message might include characteristics of the detector and the cell phone, respectively. For example, the sound suppression request message from the detector might include information about the tone, frequency, duration, and volume of an alarm that the detector is prepared to produce. Additionally, the sound suppression request message from the detector might include priority information, giving the detector higher priority than any other device such as the cell phone.

In another example, the sound suppression request message may indicate a maximum (or threshold) volume or other indicators to request or indicate a limit to volume that may be produced by the first device 102. When the first device 102 receives a sound suppression request message that includes a maximum (or threshold) volume or other indicator, then the first device 102 may be configured to reduce its volume to the indicated threshold. If the sound suppression request message includes a time indicator, the first device 102 may refrain from producing sound above the maximum volume temporarily for a period of time associated with the time indicator.

Alternatively, the sound suppression request message 120 might include a device identifier that identifies the second device as a detector. The sound system might be configured to retrieve the sound profile of the detector from a lookup table that associates sound profiles or priorities for each type of device. Thus, the lookup table can include such parameters as the tone, frequency, duration, and volume of the alarm that a detector can produce and the various types of ring tones that a cell phone can produce. The lookup table might also include a priority associated with each class of device, ascribing higher priority to the detector than to the cell phone. When the sound system receives the sound suppression request messages from the detector and the cell phone, the sound system can compare the sound profile included in each sound suppression request message to the sound profile of the sound system. Based upon the three sound profiles (or relative priorities), the sound system can reduce a volume of sound that is produced by the sound system to permit the detector to produce an audible alarm. In some implementations, after the detector has produced the audible alarm, the sound system may resume the volume or may further suppress the volume to permit the cell phone to ring. The sound system can resume producing sound at the sound system's original volume. In another embodiment, a device 102, 108, 114 might have a configurable sound profile that can vary. For instance, a device 102, 108, 114 might have a configurable priority that can be changed depending upon user preferences.

Figure 2:
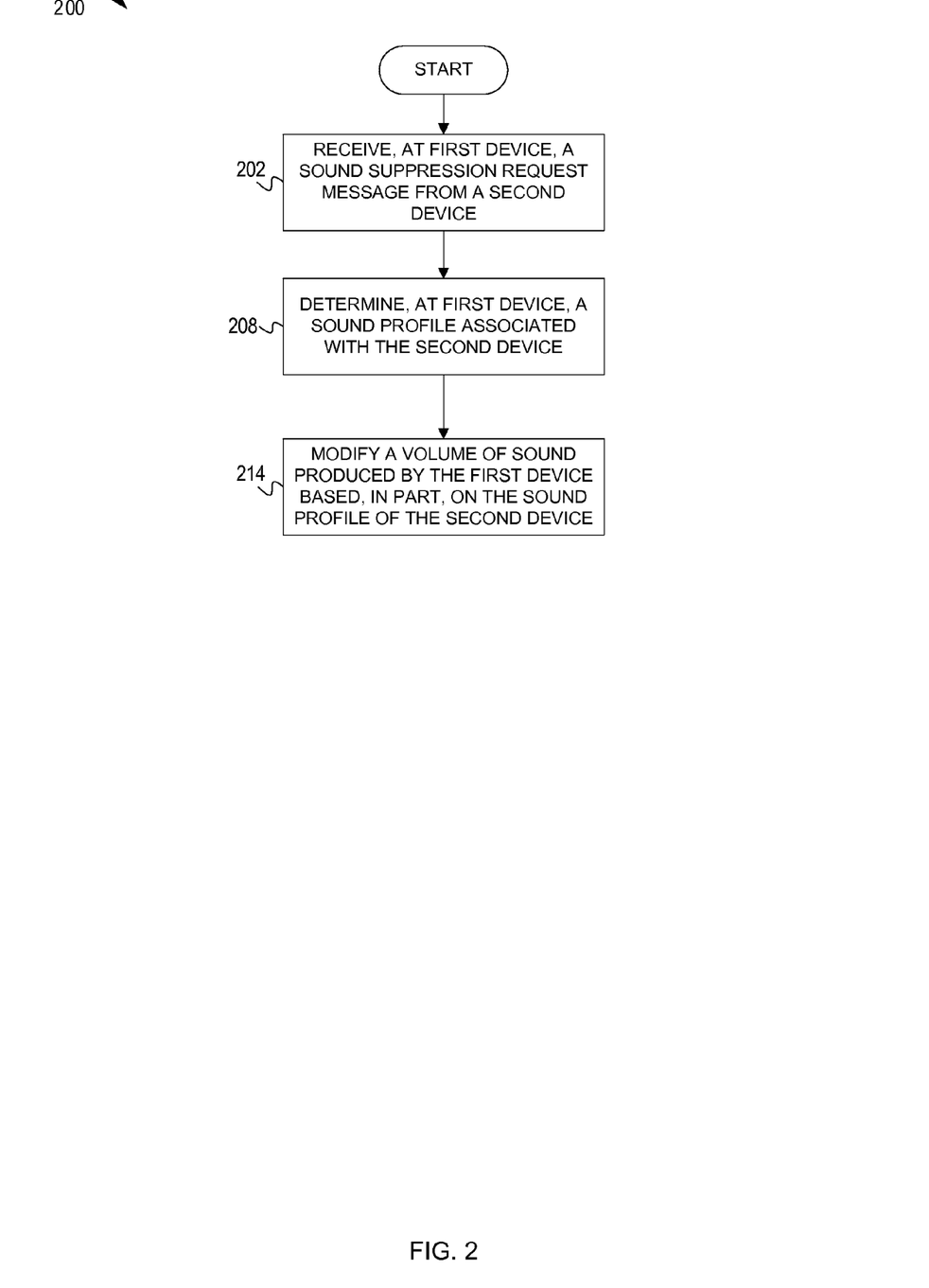
FIG. 2 is a flow diagram illustrating example operations for implementing techniques to suppress sound via a network, according to some embodiments.

FIG. 2 is a flow diagram ("flow") 200 illustrating example operations for a method and apparatus to suppress sound. At block 202, a first device (such as first device 102 of FIG. 1) can receive a sound suppression request message from a second device. At block 208, the first device may determine a sound profile associated with the second device. In one embodiment, the first device may use data included in the sound suppression request message to determine the sound profile associated with the second device. For example, the sound suppression request message from the second device may include sound profile data. In another example, the first device may use service discovery messages to detect a device type associated with the second device. The device type may be associated with a particular sound profile. For example, a different sound profile can be associated with each device type. Sound profile data can be stored in a lookup table in a memory of the first device.

At block 214, the first device can modify (e.g., suppress or reduce) a volume of sound that the first device generates using the sound profile of the second device. A sound profile of the second device can include parameters such as the tone, frequency, volume, and duration of sound associated with an alarm produced by a second device. The first device then can adjust the volume of sound that the first device produces using these parameters.

Figure 3:
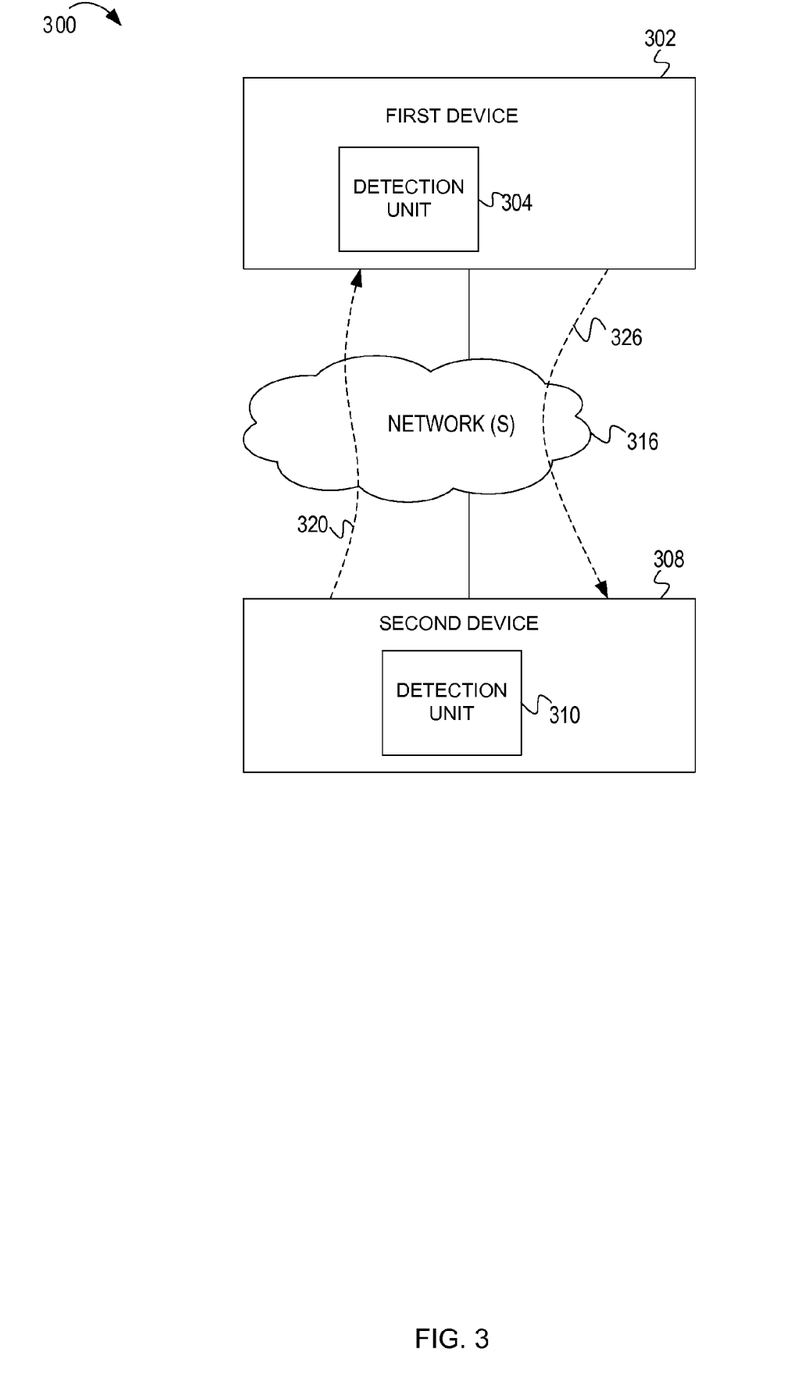
FIG. 3 is an example block diagram illustrating an implementation incorporating a first device and a second device, according to some embodiments.

FIG. 3 is an example block diagram illustrating an implementation incorporating a first device and a second device, according to some embodiments. The embodiment 300 may include a first device 302 (similar to first device 102) and a second device 308 (similar to second device 108). The first device 302 is communicatively coupled to the second device 308 through network 316 which can be a local area network (LAN), a wide area network (WAN), or the Internet. Device 302, 308 may be a device that produces audible sound, that is capable of producing an alarm stimulus designed to attract attention from users, or both. An alarm stimulus can be an audible or visual cue intended to attract human attention. For example, first device 302 can be a cell phone that can behave both as a sound device and an alarm device. Furthermore, a device may incorporate sound characteristics; for example, device 302, 308 may incorporate characteristics like the tone, frequency, volume, and duration of an audible alarm that the device can produce or the volume of sound that the device produces at certain times or generally (such as ambient noise). Thus, second device 308, e.g., a doorbell, can store information about the tone, frequency, duration, and volume of an alarm sound that the doorbell can generate. This information can be included in a sound suppression request message 320 that the doorbell transmits to first device 302 that produces sound. The sound suppression request message 320 is discussed in greater detail in FIG. 5. In some embodiments, first device 302 may transmit a sound suppression acknowledgment message 326 to second device 308. The sound suppression acknowledgment message 326 can indicate that the first device 302 has received and processed the information included in the sound suppression request message 320. The sound suppression acknowledgment message will be discussed in further detail below. In one embodiment, device 302, 308 may incorporate a detection unit 304, 310 to determine whether another device 302, 308 on network 316 produces audible sound. In one embodiment, first device 302 that produces audible sound transmits a message from the device's detection unit 304 to second device 308 on network 316. The second device 308 also may incorporate a detection unit 310 that can receive the message transmitted from the first device 302. The message can be decoded at the detection unit 310 of the second device 308 to indicate that the first device 302 produces audible sound. In one embodiment, at least one device 302, 308 is a hybrid device that can communicate on multiple communication protocols such as, for example, Ethernet, coaxial cable, Wi-Fi, broadband over power line, or other communications protocols (e.g., complying with the IEEE 1905.1 standard). The network 316 may be a hybrid network involving use of multiple communication protocols. For example, the network 316 may incorporate coaxial cable, broadband over power-line, Ethernet, Wi-Fi, Bluetooth, or any combination of communication protocols.

Figure 4:
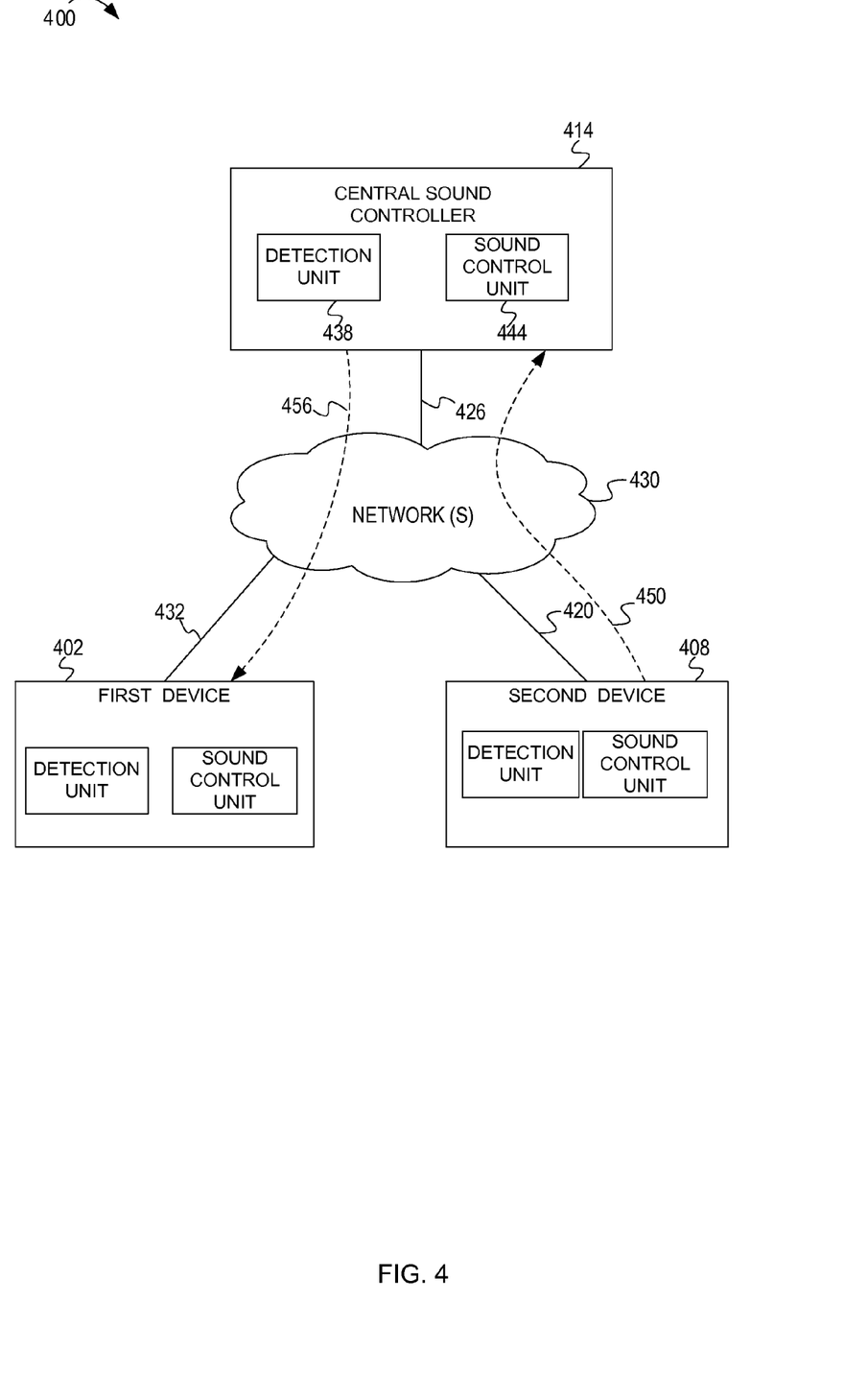
FIG. 4 is an example block diagram an implementation of a central sound controller, according to some embodiments.

FIG. 4 is an example block diagram illustrating an embodiment incorporating a central sound controller, according to some implementations. The embodiment 400 includes a central sound controller 414, a first device 402, and a second device 408. The central sound controller 414 can perform similar functions as the first device 402 and the second device 408. For example, the central sound controller 414 can be a sound device like device 402 or an alarm device like device 408. A second device 408 that is poised to produce an audible alarm can transmit a sound suppression request message 450 to the central sound controller 414. A detection unit 438 of the central sound controller 414 can receive the sound suppression request message 450, detect the presence of a first device 402, linked through the network 430, that produces audible sound, and collect information about the sound profile of the first device 402. In another embodiment, the central sound controller 414 can collect sound profile information about the first device 402 by periodically sending a sound profile request message to the first device 402 and receiving a sound production message from the first device 402. Alternatively, whenever the first device 402 produces audible sound, the first device 402 can send a sound production message to the central sound controller 414. Accordingly, the central sound controller 414 can store sound profile information about the first device 402. The collected information can include parameters such as the tone, frequency, and volume of the sound that the first device 402 produces. The collected information can also include a priority as discussed in FIG. 1. For instance, the first device 402 and the second device 408 might both have alarm features. However, the first device 402 might have a higher priority than the second device 408 as discussed more fully below. The detection unit 438 can store the sound profile information in a memory. The devices 402, 408 and the central sound controller 414 can be communicatively coupled through communication links 420, 426, and 432. The sound suppression request message 450 can include a sound profile of the second device 408. The sound profile of the second device 408 can include the tone, frequency, duration, volume, and priority of each type of audible alarm that a second device 408 can produce. For instance, a second device 408 might be configurable to produce different types of alarms (e.g., cell phone ring tones). Therefore, the sound profile of the second device 408 can include sound data for each type of alarm that the second device 408 can produce. The central sound controller 414 can store this sound profile information in a memory. A sound control unit 444 of the central sound controller 414 can analyze the sound profile of the second device 408 and the first device 402, comparing such parameters as their tones, frequencies, volumes, and priorities. If, based on this comparison, the sound that the first device 402 produces interferes or is likely to interfere with the sound that the second device 408 can produce, the sound control unit 444 can transmit a sound control message 456 to the first device 402 to cause the first device to reduce the volume of sound that the first device produces. Moreover, the sound control unit 444 can compare the priorities of the first device 402 and the second device 408 and choose the device with the highest priority.

The central sound controller may send a sound control message 456 to the first device 402 to cause the first device 402 to modify a volume of sound produced by the first device 402. The sound control message 456 can specify the magnitude to which the first device is to reduce the volume of sound that the first device produces. The sound control message 456 can also specify the amount of time during which the first device 402 is to reduce the volume of sound that the first device produces.

Figure 5:
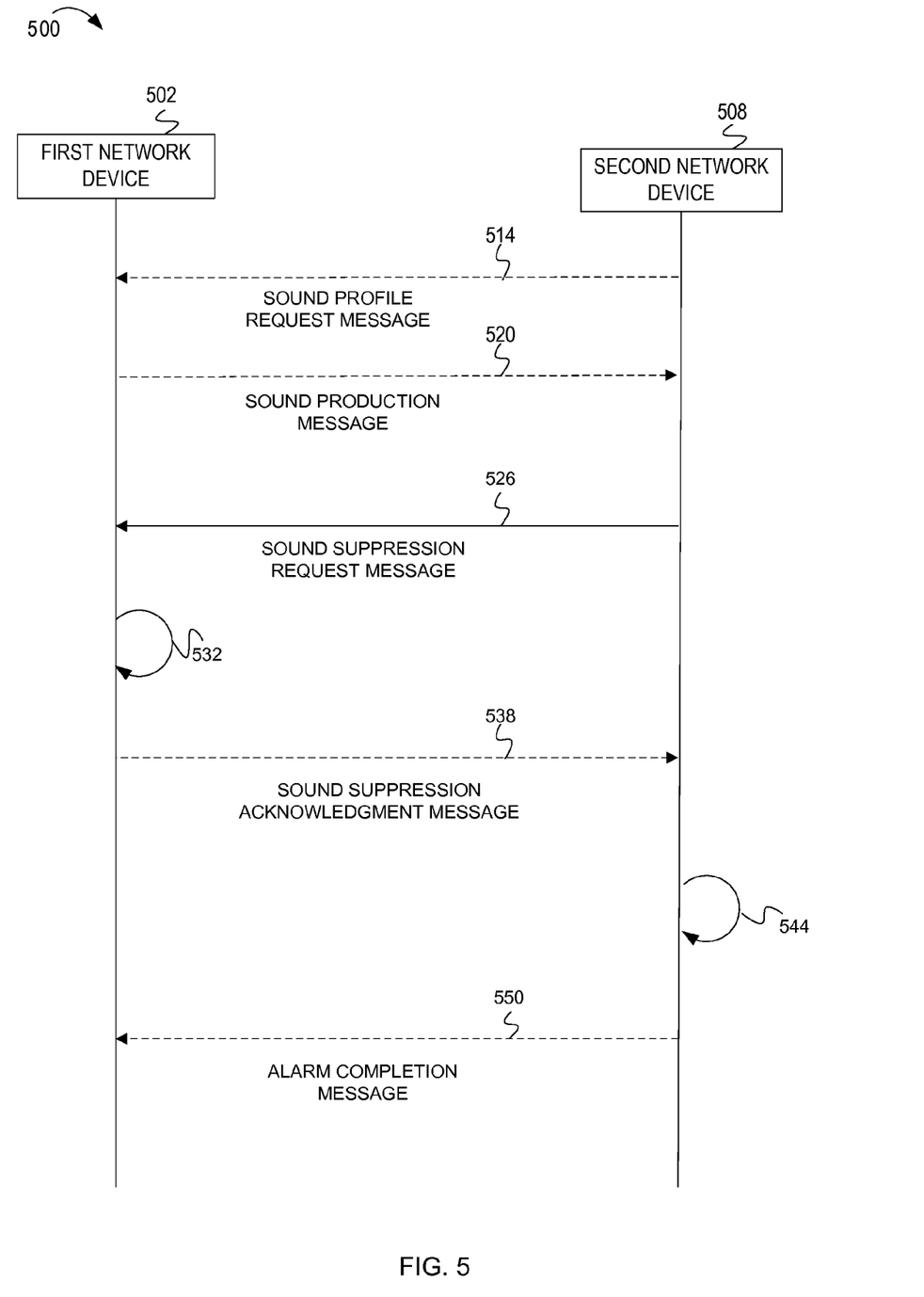
FIG. 5 is a network diagram illustrating messages that can be exchanged between a first device and a second device in accordance with some embodiments.

FIG. 5 is an example network diagram 500 depicting various messages that can be exchanged between a first device 502 and a second device 508. The first device 502 and the second device 508 may be similar to the first device 102, 302, 402 and the second device 108, 308, 408 depicted in FIGS. 1, 3, and 4. Several of the messages described in connection with FIG. 5 may be optional. A second device 508 may transmit a sound profile request message 514 to a first device 502. The sound profile request message 514 queries the first device 502 as to whether the first device is producing audible sound. The first device 502 can be configured to transmit a sound production message 520 as a reply to the second device 508 if the first device 502 produces audible sound. The second device 508 can transmit a sound suppression request message 526 to the first device 502. The sound suppression request message 526 can include sound profile information 532 about the second device 508. This sound profile information 532 can include such parameters as the tone, frequency, duration, and volume of an alarm that second device 508 can generate. Receipt of the sound suppression request message 526 can cause the first device 502 to process the information 532. For example, the first device 502 may compare the volume and frequency of sound that the first device produces against the volume and frequency of sound that the second device 508 produces. If the volume and frequency of sound that the first device 502 generates is likely to interfere with the volume and frequency of sound that the second device 508 produces, then the first device 502 can reduce the volume of sound that the first device generates. Alternatively, the first device 502 might mute itself for a period of time as discussed in more detail in FIGS. 6 and 7. In one embodiment, the first device 502 can transmit a sound suppression acknowledgment message 538 to the second device 508. The sound suppression acknowledgment message 538 can indicate that the first device 502 has reduced the volume of sound that the first device generates. Thus, receipt of the sound suppression acknowledgment message 538 by the second device 508 may trigger the second device 508 to generate an audible alarm 544. In one implementation, a second device may transmit an alarm completion message 550 to the first device 502. The alarm completion message 550 can indicate that the second device 508 has generated an audible alarm. This can serve as a cue to the first device 502 to resume generating sound at the volume at which the second device 508 produced sound prior to suppressing or reducing the volume of sound that the second device 508 produced in response to receipt of the sound suppression request message 526. An embodiment like the one depicted in FIG. 4 can have similar messages as those described in the context of FIG. 5. However, in the embodiment depicted in FIG. 4, after receiving a sound suppression request message 526 from a first device, a central sound controller may transmit a sound control message as discussed above in the context of FIG. 4 to the second device.

Figure 6:
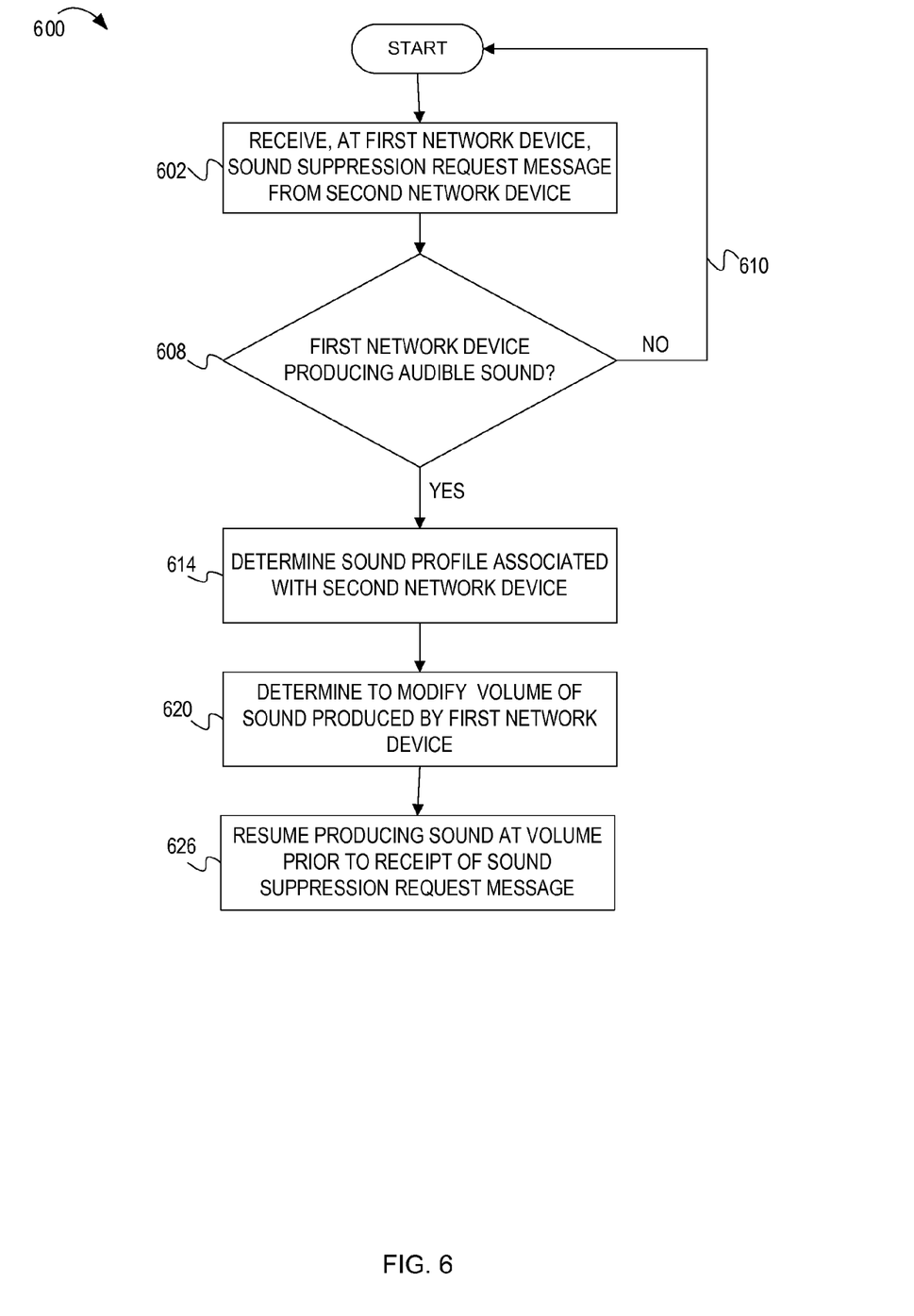
FIG. 6 is a flow diagram illustrating example operations for implementing sound suppression techniques, according to some embodiments.

FIG. 6 is a flow diagram ("flow") illustrating example operations for implementing a sound suppression method and apparatus, according to some embodiments. The flow can start at block 602. At block 602, a first device receives a sound suppression request message from a second device. In one embodiment, the first device periodically checks to determine whether the first device has received a sound suppression request message. For example, a stereo sound system can be a first device, and an alarm clock can be a second device. The alarm clock can transmit a sound suppression request message to the stereo sound system. The sound suppression request message can include information about the sound profile of the second device. This sound profile information can include parameters such as the tone, frequency, volume, and duration of an audible alarm that the second device can generate. The flow then proceeds to block 608. At block 608, if the first device is not producing audible sound, then the flow simply returns to a starting condition 610.

Conversely, if the first device produces audible sound, then the flow proceeds to block 614. At block 614, the first device determines the sound profile associated with the second device. For example, the first device can decode the sound suppression request message. Since the sound suppression request message contains information about the tone, frequency, volume, and duration of an audible alarm that the second device can produce, the first device can store the information in a memory. In another embodiment, the sound suppression request message includes a device identifier associated with a class or type of devices. For example, the device identifier can be a numeric value assigned to each class or type of device. Thus, microwave ovens would be assigned one numeric value, while alarm clocks would be assigned another numeric value. The first device can be configured with sound profile information that is associated with each class or type of device. For instance, if the second device is a microwave oven, the first device can be configured with the sound profile associated with a microwave oven. In another implementation, a device identifier can include information about the make and model of a device in addition to device class or type. For instance, a device identifier can be a numeric value associated with a specific make and model of microwave oven. The first device can be configured to store information about the sound characteristics associated with each device identifier in a memory. Alternatively, the device identifier itself could include information about the sound profile of the second device. For instance, a device identifier can be a numeric value that includes information about the tone, frequency, volume, and duration of an audible alarm that a second device can generate. In some instances, a second device might be capable of producing various kinds of alarms. For instance, a cell phone might have multiple ring tones, each with a different frequency, volume, or duration. A device identifier might be a numeric value encoding the type or class of device (e.g., a cell phone) and sound profile information about some or all of the alarms that a second device might produce. Alternatively or additionally, a device identifier might also include information about the sound profile of a selected alarm. For example, if the second device is a cell phone, a device identifier might include sound profile information about the particular ring tone that the cell phone generates. If the cell phone subsequently generates a different ring tone, the device identifier can change accordingly to include this new data.

At block 620, the first device determines whether to modify the volume of sound that the first device generates. In one embodiment, the first device can compare the tone, frequency, and volume of sound that the first device generates against the tone, frequency, and volume of sound that the second device can produce. Such a comparison can also include the priority of each device. If, based on these parameters, the sound that the first device produces is likely to interfere with an audible alarm, then the first device can suppress or reduce the volume of sound that the first device produces. Otherwise, the first device takes no action. In one implementation, the first device can suppress or reduce the volume of sound that the first device generates. The first device then can transmit a sound suppression acknowledgment message to the second device. The sound suppression acknowledgment message can indicate to the second device that the first device has suppressed or reduced the volume of sound that the first device generates. In another implementation, the second device is configured so that a timer is set. This timer can be set, for example, after the second device transmits the sound suppression request message to the first device; however, other configurations are possible. The timer may measure an amount of time associated with a time during which the first device will reduce a volume of sound that the first device generates. In one embodiment, after the second device measures this period of time, the second device can generate an audible alarm. At block 626, the first device resumes producing a volume of sound that the first device generated prior to reducing the volume of sound that the first device produced. In one implementation, the first device receives an alarm completion message from the second device after the second device generates an audible alarm. The receipt of this alarm completion message prompts the first device to resume producing sound at the volume at which the first device had previously produced it. In another embodiment, the first device is configured to set a timer. In one implementation, the first device can set this timer after reducing a volume of sound that the first device produces; however, it also can set this timer at any point in the technique. The first device already has stored in a memory the duration of the audible alarm that the second device can produce. The first device can then count an amount of time that equals this duration. After this timeframe lapses, the first device can resume producing sound at the volume at which the first device previously generated sound. In another implementation, the first device can produce an alarm for the second device. As discussed above, the first device receives a sound suppression request message from the second device. The sound suppression request message includes a sound profile of the second device, such as the tone, frequency, volume, and duration of an alarm that the second device can produce. Thus, the first device can store in a memory these sound characteristics of the second device. The first device can reduce or mute a volume of sound that that the first device generates. The first device can produce an alarm for the second device.

Figure 7:
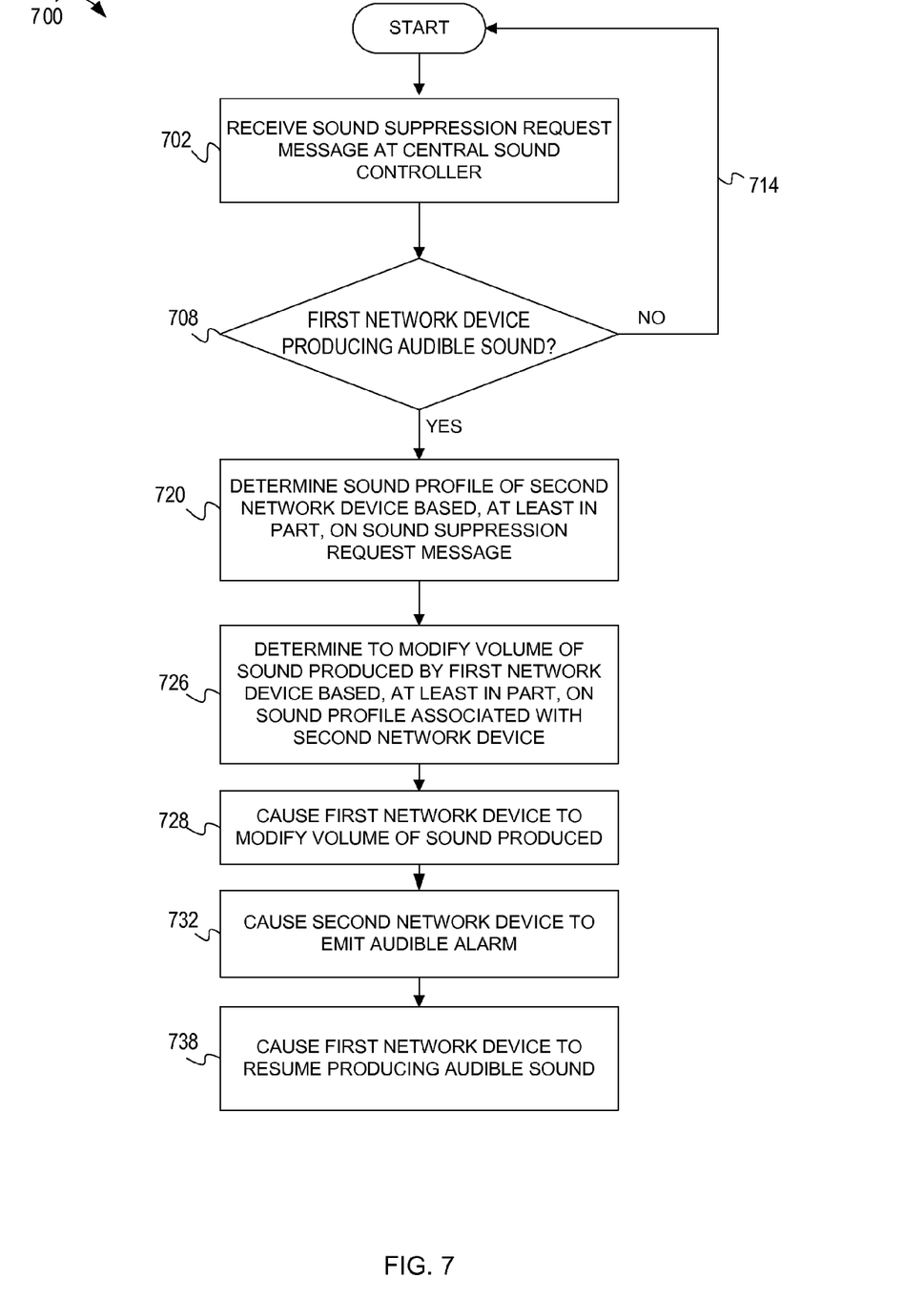
FIG. 7 is a flow diagram illustrating example operations for implementing sound suppression techniques incorporating a central sound controller, according to some embodiments.
Figure 8:
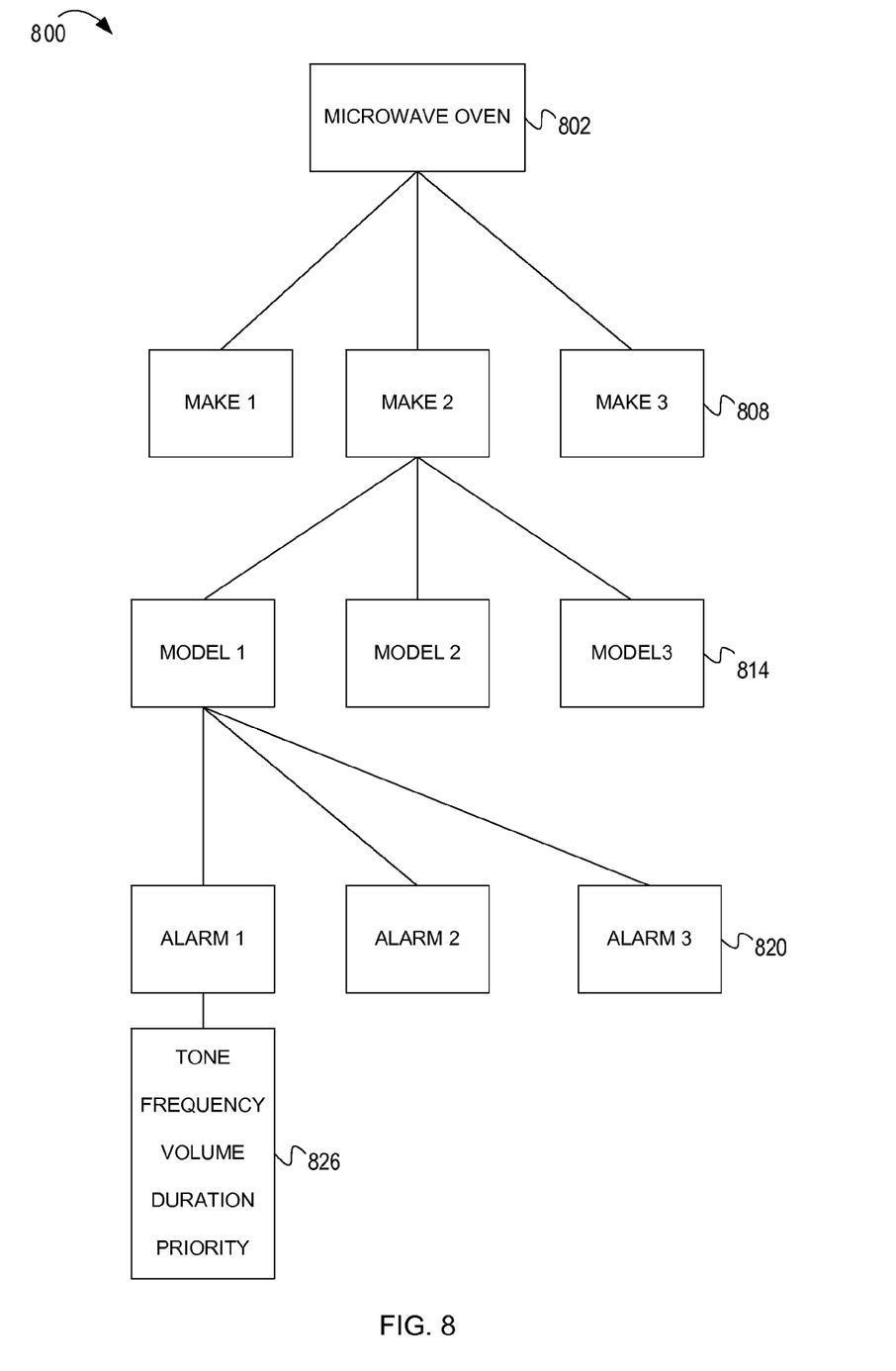
FIG. 8 is a conceptual diagram illustrating a sound profile based on classification of devices, according to some embodiments.

FIG. 7 is flow diagram ("flow") illustrating operations of an embodiment incorporating a central sound controller as depicted in FIG. 4. At block 702, a central sound controller receives a sound suppression request message. In one implementation, a second device transmits a sound suppression request message to the central sound controller prior to producing an audible alarm. However, in other embodiments, the second device can transmit a sound suppression request message to the central sound controller while or after producing an audible alarm. For instance, a second device may produce an audible alarm, transmit a sound suppression request message to the central sound controller, and then produce another audible alarm. The sound suppression request message can include a sound profile of the second device. Alternatively or additionally, the sound suppression request message can be a device identifier that includes data about the type or class of device, such as whether a device is a microwave oven, cell phone, or alarm clock, for instance. The flow proceeds to block 708. At block 708, a central sound controller determines whether a first device is producing audible sound. In one implementation, a first device can be configured so that the first device transmits a sound production message to the central sound controller if the first device is producing audible sound. The sound production message can include sound profile characteristics of the first device. Alternatively or additionally, the sound profile characteristics of the first device may be included in a device identifier as described above. In another implementation, the central sound controller incorporates a detection unit. The detection unit can detect devices on a network that produce audible sound. For example, in some implementations, a detection unit may periodically transmit a sound control message to some or all devices on the network. The devices that receive the sound control message can be configured to transmit a response if they are producing audible sound. This response can include the sound profile of the first device. In another embodiment, the central sound controller transmits a sound control message to some or all devices on the network, such as to the first device, in response to receipt of a sound suppression request message. If a first device is not producing audible sound, the flow can return to a starting point 714. Otherwise, the flow proceeds to block 720. At block 720, a central sound controller determines the sound profile of a second device, based, at least in part, on the sound suppression request message. As discussed above, the sound suppression request message can include data associated with the sound characteristics of the second device. The flow proceeds to block 726. At block 726, the central sound controller determines whether to modify the volume of sound produced by the first device based, at least in part, on the sound profile associated with the second device and the first device. For example, the central sound controller can compare sound profile of the first device and the sound profile of the second device. Based on this comparison, the central sound controller can determine whether to modify the volume of sound produced by a first device. For instance, a first device might be producing sound at a sufficiently low volume or at a frequency such that the sound that the first device generates is unlikely to interfere with the sound that the second device can produce. In such an event, the central sound controller may not transmit a sound control message to the first device to cause the first device to reduce a volume of sound. In another embodiment, the central sound controller can be configured with a lookup table. The lookup table can store sound profile data that the central sound controller receives from the first device and the second device. Other data structures also can be implemented to store sound profile information that the central sound controller receives from the first and second devices. For example, a tree 800 can be implemented as depicted in FIG. 8. The first level 802 can be a class or category of devices; for instance, the first level can be the class of microwave ovens. The next level 808 can be a make of microwave oven. The third level 814 can be a model of microwave oven. The subsequent level 820 can be an alarm type associated with the particular model. The next level 826 can be the sound profile of the particular alarm type. The central sound controller may receive information from the first device and the second device in the form of a device identifier. For instance, the second device might transmit a sound suppression request message that indicates that the second device is a particular make and model of microwave oven that requests permission to produce a particular type of alarm. The first device might transmit a device identifier to the central sound controller indicating that the first device is a stereo sound system. The central sound controller then can lookup the sound profile information of each device as stored in a tree data structure like the one depicted in FIG. 8.

The flow then proceeds to block 728. At block 728, the central sound controller causes the first device to reduce the volume of sound that the first device produces. In one implementation, a central sound controller can transmit a sound control message to the first device to cause the first device to reduce the volume of sound that the first device produces. The flow then proceeds to block 732. At block 732, the central sound controller causes the second device to produce an audible alarm. In one embodiment, the central sound controller transmits a sound suppression acknowledgment message to the second device. The second device can be configured to produce an audible alarm in response to receiving the sound suppression acknowledgment message. In another embodiment, the central sound controller produces an audible alarm for the second device. The central sound controller can maintain in a memory information about characteristics that constitute the sound profile of the second device. The central sound controller can use this data to produce an audible alarm for the second device. At block 738, the central sound controller causes the first device to resume producing audible sound. In one embodiment, the central sound controller could transmit a sound resumption message to the first device. For instance, the second device can transmit an alarm completion message to the central sound controller, indicating that the second device has produced an alarm. Upon receipt of this alarm completion message, the central sound controller can transmit a sound resumption message to the first device. The sound resumption message instructs the first device to continue producing sound at the volume at which the first device originally produced sound. In another implementation, the central sound controller causes the first device to initiate a timer. For example, the central sound controller could cause the first device to initiate a timer when the central sound controller transmits a sound control message to the first device. However, other timing is also possible. The sound control message can also include information about the duration of the audible alarm that the second device can produce. The timer set at the first device can count an amount of time associated with the time used by the second device to produce an audible alarm. After conclusion of this time, the first device can be configured to resume producing audible sound at the volume at which the first device originally produced it.

The embodiments discussed herein are not exhaustive. One skilled in the art could implement permutations of the methods and apparatus described above. However, the description above identifies various implementations that could give effect to a method and apparatus for suppressing sound.

It should be understood that FIGS. 1-8 and the operations described herein are examples meant to aid in understanding embodiments and should not be used to limit embodiments or limit scope of the claims. Embodiments may perform additional operations, fewer operations, operations in parallel or in a different order, and some operations differently. As will be appreciated by one skilled in the art, aspects of the present subject matter may be embodied as a system, method, or computer program product.

Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer usable program code embodied in the medium. The described embodiments also may be implemented in non-transitory machine readable medium having instructions to perform the methods described herein.

Any combination of one or more non-transitory machine readable medium(s) may be utilized. Non-transitory computer-readable media comprise all computer-readable media, with the sole exception being a transitory, propagating signal. A machine readable medium includes any mechanism for storing or transmitting information in a form (e.g., software, processing application) readable by a machine (e.g., a computer). The machine-readable medium may include, but is not limited to, magnetic storage medium (e.g., hard drive); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions. In addition, embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/operations specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
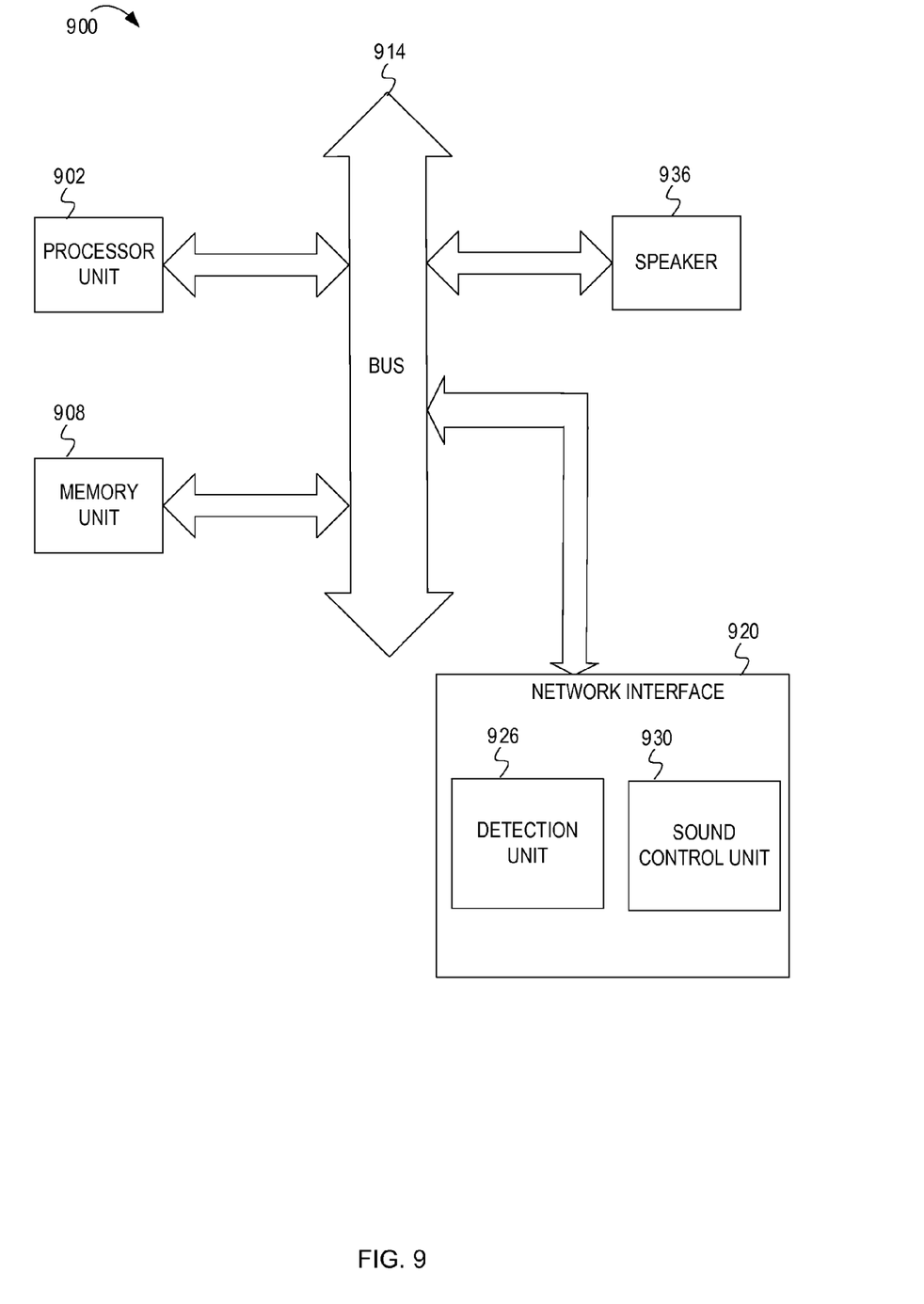
FIG. 9 is a block diagram of one embodiment of a sound suppression device including a detection unit and a control unit, according to some embodiments.

FIG. 9 depicts a particular embodiment of a device 900 like the ones illustrated in FIGS. 1, 3, and 4. The device 900 depicted in FIG. 9 also can be a central sound controller as depicted in FIG. 4. The device 900 can include a processor unit 902. The processor unit 902 can include multiple processors, multiple cores, multiple nodes, and/or implement multithreading, etc. The device 900 may also include a memory unit 908. The memory unit 908 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable storage media. The device 900 also can include a bus 914 (e.g., PCI, ISA, PCI-Express, HyperTransport®, InfiniBand®, NuBus, AHB, AXI, etc.), and network interface(s) 920 that include at least one of a wireless network interface (e.g., a Bluetooth interface, a WLAN 802.11 interface, a WiMAX interface, a ZigBee® interface, a Wireless USB interface, etc.) and a wired network interface (e.g., an Ethernet interface, a powerline communication interface, etc.). In some embodiments, a device 900 can include a detection unit 926. The detection unit can detect the presence on a network of devices that are producing audible sound as discussed in FIG. 4. The detection unit can be implemented in software, hardware, or a combination of the two. For instance, the detection unit can be an application specific integrated circuit (ASIC). Alternatively, the detection unit can be a general purpose integrated circuit, configured to execute the features described in FIG. 4. The device 900 may also incorporate a control unit 930. The control unit 930 can perform those functions described in FIG. 4. The control unit 930 can be implemented in hardware, software, or a combination of the two. Additionally, the control unit 930 may be implemented together with detection unit 926 as part of a system on a chip (SoC). Moreover, the device may include a speaker 936 that produces sound or an audible alarm. The speaker 936 is depicted as connected to the bus 914. However, the speaker 936 also could be incorporated into another component.

While the embodiments are described with reference to various implementations and exploitations, it will be understood that these embodiments are illustrative and that the scope of the inventive subject matter is not limited to them. In general, techniques for automatic sound control as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   receiving, at a first device from a second device, a first message that at least indicates a first frequency of a first sound of the second device;
   determining whether a second sound produced by the first device could interfere or interferes with the first sound based, at least in part, on the first frequency, after receiving the first message; and
   modifying the second sound to avoid interfering or to no longer interfere with the first sound in response to determining that the second sound could interfere or interferes with the first sound.

2. The method of claim 1, wherein modifying the second sound comprises suppressing the second sound or reducing volume of the second sound.

3. The method of claim 1, wherein the first message further indicates at least one member selected from the group consisting of a volume of the first sound, a duration of the first sound, and a type of the second device.

4. The method of claim 1, wherein the first sound is an alarm associated with the second device.

5. The method of claim 1, wherein determining whether the second sound could interfere or interferes with the first sound comprises comparing a second frequency of the first device against the first frequency.

6. The method of claim 5, wherein determining whether the second sound could interfere or interferes with the first sound further comprises comparing a volume of the second sound against a volume of the first sound, wherein the first message also indicates the volume of the first sound.

7. The method of claim 1 further comprising:
   comparing a first sound profile of the first device against a second sound profile of the second device, wherein the first message indicates the second sound profile;
   wherein determining whether the second sound could interfere or interferes with the first sound is based, at least in part, on comparing the first sound profile against the second sound profile.

8. The method of claim 1 further comprising:
   subsequently receiving a second message from the second device, wherein the second message indicates the second device; and
   looking up, by the first device, the first frequency in a local memory based, at least in part, on the indication of the second device in the second message, wherein the first device stored the first frequency and the indication of the second device in the local memory after receiving the first message.

9. The method of claim 1 further comprising:
   subsequently receiving a second message from the second device, wherein the second message indicates an alarm corresponding to the first sound; and
   looking up, by the first device, the first frequency in a local memory based, at least in part, on the indication of the alarm in the second message, wherein the first message also indicated the alarm and the first device stored the first frequency and the indication of the alarm in the local memory after receiving the first message.

10. The method of claim 1 further comprising:
    subsequently receiving a second message from the second device, wherein the second message indicates an alarm corresponding to the first sound;
    setting, by the first device, a timer based, at least in part, on a duration of the alarm, wherein the first message indicated the duration and the first device stored the duration in association with the first frequency in a local memory after receiving the first message; and
    restoring the second sound after expiration of the timer.

11. The method of claim 1 further comprising:
    subsequently receiving a second message from the second device, wherein the second message indicates an alarm corresponding to the first sound;
    setting, by the first device, a timer based, at least in part, on a duration of the alarm, wherein the first message indicated the duration and the first device stored the duration in association with the first frequency in a local memory after receiving the first message; and
    suppressing any sound by the first device until expiration of the timer.

12. The method of claim 1 further comprising producing the first sound by the first device for the second device after modifying the second sound.

13. The method of claim 12, wherein modifying the second sound comprises reducing volume of the second sound or suppressing the second sound.

14. The method of claim 1 further comprising:
    receiving a second message that indicates completion of an alarm corresponding to the first sound.

15. The method of claim 14 further comprising restoring the second sound after receiving the second message.

16. The method of claim 1 further comprising:
    receiving a second message prior to the first message, wherein the second message indicates a plurality of alarms of the second device, wherein the plurality of alarms includes a first alarm corresponding to the first sound;

indicating, by the first device, the plurality of alarms in a local memory; and retrieving, from the local memory, an indication of the first alarm in response to receiving the first message, wherein the indication of the first alarm indicates the first frequency and at least one member selected from a group consisting of a volume of the first alarm and a duration of the first alarm.

17. The method of claim 16, wherein the first message also includes at least one member selected from a group consisting of an identifier of the first alarm or an identifier of the second device.

18. A method comprising:

transmitting, by a first device, a sound profile message to a second device, the sound profile message indicating a first sound profile of a first alarm and indicating the first device, wherein the first sound profile indicates a frequency and a volume of the first alarm;

determining, at the first device, to produce the first alarm;

transmitting a sound suppression request message from the first device to the second device, in response to determining to produce the first alarm transmitting an alarm completion message from the first device to the second device after completion of the first alarm.

19. The method of claim 18, wherein the sound suppression request message is broadcast via a network.

20. The method of claim 18, further comprising:

producing the first alarm after transmitting the sound suppression request message.

21. The method of claim 18, wherein the alarm completion message indicates that the second device can resume producing sound as the second device was producing prior to the sound suppression request message.

22. The method of claim 18, further comprising:

receiving, at the first device, a sound production message from the second device in response to the sound profile message.

23. The method of claim 18, further comprising, after transmitting the sound suppression request message:

receiving, at the first device, a sound suppression acknowledgment message from the second device; and producing the first alarm in response to receiving the sound suppression acknowledgement message.

24. The method of claim 18, wherein the sound profile message also indicates a second sound profile of a second alarm, wherein the sound suppression request message indicates the first alarm.

25. A first device comprising:

a network interface;

a processor; and a machine readable medium having program instructions executable by the processor to cause the first device to:

detect receipt of a first message via the network interface, wherein the first message at least indicates a first frequency of a first sound; and determine whether a second sound produced by the first device could interfere or interferes with the first sound based, at least in part, on the first frequency, after receiving the first message; and modify the second sound to avoid interfering or to no longer interfere with the first sound, in response to determining that the second sound could interfere or interferes with the first sound.

26. The first device of claim 25, wherein the program instructions executable by the processor to cause the first device to determine whether the second sound could interfere or interferes with the first sound comprises program instructions executable by the processor to cause the first device to compare a second frequency of the first device against the first frequency.

27. The first device of claim 25, wherein the machine readable medium further has program instructions executable by the processor to cause the first device to:

detect receipt of a second message from a second device, wherein the second message indicates the second device; and look up the first frequency in a memory of the first device based, at least in part, on the indication of the second device in the second message, wherein the first device stored the first frequency and the indication of the second device in a local memory after receiving the first message.

28. The first device of claim 25, wherein the machine readable medium further has program instructions executable by the processor to cause the first device to:

detect receipt of a second message from a second device, wherein the second message indicates an alarm corresponding to the first sound; and look up the first frequency in a memory of the first device based, at least in part, on the indication of the alarm in the second message, wherein the first message also indicated the alarm and the first device stored the first frequency and the indication of the alarm in the memory after receiving the first message.

29. The first device of claim 25, wherein the machine readable medium further has program instructions executable by the processor to cause the first device to:

detect receipt of a second message from a second device, wherein the second message indicates an alarm corresponding to the first sound;

set a timer based, at least in part, on a duration of the alarm, wherein the first message indicated the duration and the first device stored the duration in association with the first frequency in a memory of the first device after receiving the first message; and restore the second sound after expiration of the timer.

30. The first device of claim 25, wherein the machine readable medium further has program instructions executable by the processor to cause the first device to produce the first sound for a second device after modifying the second sound.

31. The first device of claim 25, wherein the machine readable medium further has program instructions executable by the processor to cause the first device to:

detect receipt of a second message prior to the first message, wherein the second message indicates a plurality of alarms of a second device, wherein the plurality of alarms includes a first alarm corresponding to the first sound;

indicate the plurality of alarms in a memory of the first device; and retrieve, from the memory, an indication of the first alarm in response to receipt of the first message, wherein the indication of the first alarm indicates the first frequency and at least one member selected from a group consisting of a volume of the first alarm and a duration of the first alarm.

32. The first device of claim 31, wherein the first message also includes at least one member selected from a group consisting of an identifier of the first alarm or an identifier of the second device.

33. A non-transitory machine readable medium having machine executable instructions stored therein, the machine executable instructions comprising instructions to:
- detect receipt of a first message via a communication network from a first device, the first message at least indicating a first frequency of a first sound of the first device that sent the first message;
- determine whether a second sound produced by a second device, which received the first message, could interfere or interferes with the first sound based, at least in part, on the first frequency; and
- modify the second sound produced by the second device to avoid interfering or to no longer interfere with the first sound in response to determining that the second sound could interfere or interferes with the first sound.

34. The non-transitory machine readable medium of claim 33, wherein the instructions to determine whether the second sound could interfere or interferes with the first sound further comprises instructions to compare a volume of the second sound against a volume of the first sound, wherein the first message also indicated the volume of the first sound.

35. The non-transitory machine readable medium of claim 33, wherein the instructions comprise instructions to cause the second device to produce the first sound for the first device after modification of the second sound.

* * * * *